US011011117B2

(12) United States Patent
Yang

(10) Patent No.: US 11,011,117 B2
(45) Date of Patent: May 18, 2021

(54) SHIFT REGISTER, DRIVE METHOD THEREOF, DRIVE CONTROL CIRCUIT, AND DISPLAY APPARATUS

(71) Applicant: BOE TECHNOLOGY GROUP CO., LTD., Beijing (CN)

(72) Inventor: Chengchung Yang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 211 days.

(21) Appl. No.: 16/317,361

(22) PCT Filed: Apr. 24, 2018

(86) PCT No.: PCT/CN2018/084219
§ 371 (c)(1),
(2) Date: Jan. 11, 2019

(87) PCT Pub. No.: WO2019/037457
PCT Pub. Date: Feb. 28, 2019

(65) Prior Publication Data

US 2020/0388227 A1 Dec. 10, 2020

(30) Foreign Application Priority Data

Aug. 21, 2017 (CN) ........................ 201710717661.X

(51) Int. Cl.
*G09G 3/3266* (2016.01)
*G09G 3/36* (2006.01)
(Continued)

(52) U.S. Cl.
CPC ......... *G09G 3/3266* (2013.01); *G09G 3/3677* (2013.01); *G11C 19/28* (2013.01);
(Continued)

(58) Field of Classification Search
CPC .. G09G 3/3266; G09G 3/3677; G09G 3/3225; G09G 2300/0426; G09G 2310/0286; G09G 2310/08; G11C 19/28
See application file for complete search history.

(56) References Cited

U.S. PATENT DOCUMENTS

2011/0002437 A1 1/2011 Su et al.
2011/0069044 A1* 3/2011 Lee ...................... G09G 3/3677 345/204
2017/0269769 A1* 9/2017 Hu ...................... G06F 3/04166

FOREIGN PATENT DOCUMENTS

CN 105741744 A 7/2016
CN 106952625 A 7/2017
(Continued)

OTHER PUBLICATIONS

CN-107452351-A, author: Yang;Chengchung; filed in China on Aug. 21, 2017, Published on Dec. 8, 2017, with EP3675128A1(WO2019037457A1; PCT/CN2018/084219) as an equivalent English language translation of the original Chinese language Application.*

(Continued)

*Primary Examiner* — Wing H Chow
(74) *Attorney, Agent, or Firm* — The Webb Law Firm

(57) ABSTRACT

The present disclosure provides a shift register, a drive method thereof, a drive control circuit, and a display apparatus, the shift register comprises an input sub-circuit (1), a first control sub-circuit (2), a second control sub-circuit (3), a third control sub-circuit (4), a node stabilization sub-circuit (5), a first output sub-circuit (6), and a second output sub-circuit (7).

18 Claims, 7 Drawing Sheets

(51) Int. Cl.
*G11C 19/28* (2006.01)
*G09G 3/3225* (2016.01)

(52) U.S. Cl.
CPC ... *G09G 3/3225* (2013.01); *G09G 2300/0426* (2013.01); *G09G 2310/0286* (2013.01); *G09G 2310/08* (2013.01)

(56) References Cited

FOREIGN PATENT DOCUMENTS

| | | | |
|---|---|---|---|
| CN | 107039014 | A | 8/2017 |
| CN | 107424649 | A | 12/2017 |
| CN | 107452351 | A | 12/2017 |

OTHER PUBLICATIONS

EP3675128A1, author: Yang;Chengchung; filed Apr. 24, 2018.*
First Office Action for CN Appl. No. 201710717661.X dated Feb. 12, 2019.
International Search Report and Written Opinion for International Appl. No. PCT/CN2018/084219, dated Jul. 30, 2018.

* cited by examiner

SHIFT REGISTER, DRIVE METHOD THEREOF, DRIVE CONTROL CIRCUIT, AND DISPLAY APPARATUS

CROSS-REFERENCE TO RELATED APPLICATIONS

The present application is a U.S. National Stage Application under 35 U.S.C. § 371 of International Patent Application No. PCT/CN2018/084219, filed on Apr. 24, 2018, which claims priority to Chinese Patent Application No. 201710717661.X, filed on Aug. 21, 2017, the disclosure of each of which are hereby incorporated by reference in entirety.

TECHNICAL FIELD

The present disclosure relates to a shift register, a drive method thereof, a drive control circuit, and a display apparatus.

BACKGROUND

With the rapid development of display technologies, display panels are increasingly developing in a direction of high integrity and low costs. In particular, Gate Drive on Array (GOA) technologies integrate a drive control circuit of a gate switch of a Thin Film Transistor (TFT) on an array substrate of the display panel to form a control for the gate of the TFT in the display panel, so as to save a Bonding region of the Gate Integrated Circuit (IC) and a wiring space of the Fan-out region, which may not only lower product costs in both aspects of material costs and manufacture processes but also result in symmetry of both sides and a beautiful design of narrow borders for the display panel. Further, such integration processes may further save the Bonding process in a direction of the gate scan line, so as to improve productivity and yield.

Generally, the drive control circuit, which is the gate drive circuit, consists of a plurality of cascaded shift registers, whereby to sequentially input a gate scan signal to each row of gate lines on the display panel by each stage shift register.

SUMMARY

Embodiments of the present disclosure provide a shift register, comprising: an input sub-circuit, a first control sub-circuit, a second control sub-circuit, a third control sub-circuit, a node stabilization sub-circuit, a first output sub-circuit, and a second output sub-circuit; wherein, the input sub-circuit, which is connected to an input signal terminal, a first clock signal terminal, a first node and a second node, respectively, is used for providing a signal of the input signal terminal to the first node and providing a signal of the first clock signal terminal to the second node, under a control of the first clock signal terminal;

the first control sub-circuit, which is connected to a first reference signal terminal, the first node and the second node, respectively, is used for providing a signal of the first reference signal terminal to the second node under a control of the first node;

the second control sub-circuit, which is connected to the first reference signal terminal, a second reference signal terminal, the first node, the second node and a third node, respectively, is used for providing a signal of the first reference signal terminal to the third node under a control of a signal of the first node and providing a signal of the second reference signal terminal to the third node under a control of a signal of the second node;

the third control sub-circuit, which is connected to the first reference signal terminal, the first node and the third node, respectively, is used for providing a signal of the first reference signal to the first node under a control of the third node;

the node stabilization sub-circuit, which is connected to the first node, is used for stabilizing a potential of the first node;

the first output sub-circuit, which is connected to the first node, the second reference signal terminal, and an output signal terminal of the shift register, respectively, is used for providing a signal of the second reference signal terminal to the output signal terminal under a control of a signal of the first node; and the second output sub-circuit, which is connected to the third node, the first reference signal terminal and the output signal terminal, respectively, is used for providing a signal of the first reference signal terminal to the output signal terminal under a control of a signal of the third node.

Alternatively, in the aforementioned shift register as provided in embodiments of the present disclosure, the input sub-circuit comprises a first switch transistor and a second switch transistor;

a control electrode of the first switch transistor is connected to the first clock signal terminal, a first electrode of the first switch transistor is connected to the input signal terminal, and a second electrode of the first switch transistor is connected to the first node; and both a control electrode and a first electrode of the second switch transistor are connected to the first clock signal terminal, and a second electrode of the second switch transistor is connected to the second node.

Alternatively, in the aforementioned shift register as provided in embodiments of the present disclosure, the first control sub-circuit comprises a third switch transistor;

a control electrode of the third switch transistor is connected to the first node, a first electrode of the third switch transistor is connected to the first reference signal terminal, and a second electrode of the third switch transistor is connected to the second node.

Alternatively, in the aforementioned shift register as provided in embodiments of the present disclosure, the second control sub-circuit comprises a fourth switch transistor and a fifth switch transistor;

a control electrode of the fourth switch transistor is connected to the first node, a first electrode of the fourth switch transistor is connected to the first reference signal terminal, and a second electrode of the fourth switch transistor is connected to the third node; and a control electrode of the fifth switch transistor is connected to the second node, a first electrode of the fifth switch transistor is connected to the second reference signal terminal, and a second electrode of the fifth switch transistor is connected to the third node.

Alternatively, in the aforementioned shift register as provided in embodiments of the present disclosure, the third control sub-circuit comprises a sixth switch transistor;

a control electrode of the sixth switch transistor is connected to the third node, a first electrode of the sixth switch transistor is connected to the first reference signal terminal, and a second electrode of the sixth switch transistor is connected to the first node.

Alternatively, in the aforementioned shift register as provided in embodiments of the present disclosure, the first output sub-circuit comprises a seventh switch transistor;

a control electrode of the seventh switch transistor is connected to the first node, a first electrode of the seventh switch transistor is connected to the second reference signal terminal, and a second electrode of the seventh switch transistor is connected to the output signal terminal.

Alternatively, in the aforementioned shift register as provided in embodiments of the present disclosure, the second output sub-circuit comprises an eighth switch transistor;

a control electrode of the eighth switch transistor is connected to the third node, a first electrode of the eighth switch transistor is connected to the first reference signal terminal, and a second electrode of the eighth switch transistor is connected to the output signal terminal.

Alternatively, in the aforementioned shift register as provided in embodiments of the present disclosure, each of the switch transistors is a P-type transistor, a first electrode of each of the switch transistors is a source of the P-type transistor, and a second electrode of each of the switch transistors is a drain of the P-type transistor.

Alternatively, in the aforementioned shift register as provided in embodiments of the present disclosure, each of the switch transistors is an N-type transistor, a first electrode of each of the switch transistors is a drain of the N-type transistor, and a second electrode of each of the switch transistors is a source of the N-type transistor.

Alternatively, in the aforementioned shift register as provided in embodiments of the present disclosure, the node stabilization sub-circuit comprises a capacitor; a first terminal of the capacitor is connected to the first node, and a second terminal of the capacitor is connected to the second clock signal terminal.

Accordingly, embodiments of the present disclosure further provide a drive control circuit, comprising: a plurality of cascaded any one of said shift registers as provided in embodiments of the present disclosure;

an input signal terminal of a first-stage shift register is connected to an initial signal terminal;

an input signal terminal of each stage shift register other than the first-stage shift register is connected to an output signal terminal of a last-stage shift register neighboring thereto.

Accordingly, embodiments of the present disclosure further provide a display apparatus, comprising the aforementioned drive control circuit as provided in embodiments of the present disclosure.

Alternatively, in the aforementioned display apparatus as provided in embodiments of the present disclosure, the display apparatus comprises a plurality of light emission control signal lines; a signal output terminal of each stage shift register in the drive control circuit is connected to one of the plurality of light emission control signal lines.

Alternatively, in the aforementioned display apparatus as provided in embodiments of the present disclosure, the drive control circuit is a gate drive circuit.

Accordingly, embodiments of the present disclosure further provide a drive method of any one of said shift register as provided in embodiments of the present disclosure, comprising: a first stage, a second stage, a third stage, and a fourth stage;

during the first stage, the input sub-circuit provides a signal of the input signal terminal to the first node and provides a signal of the first clock signal terminal to the second node, under a control of the first clock signal terminal; the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of a signal of the third node;

during the second stage, the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of the third node;

during the third stage, the input sub-circuit provides a signal of the input signal terminal to the first node and provides a signal of the first clock signal terminal to the second node, under a control of the first clock signal terminal; the first control sub-circuit provides a signal of the first reference signal terminal to the second node under a control of the first node; the second control sub-circuit provides a signal of the first reference signal terminal to the third node under a control of a signal of the first node; the first output sub-circuit provides a signal of the second reference signal terminal to the output signal terminal under a control of a signal of the first node;

during the fourth stage, the node stabilization sub-circuit stabilizes a potential of the first node; the first control sub-circuit provides a signal of the first reference signal terminal to the second node under a control of the first node; the second control sub-circuit provides a signal of the first reference signal terminal to the third node under a control of a signal of the first node; the first output sub-circuit provides a signal of the second reference signal terminal to the output signal terminal under a control of a signal of the first node.

Alternatively, in the aforementioned drive method as provided in embodiments of the present disclosure, after the first stage and before the second stage, further comprises: at least one insertion stage, wherein the insertion stage comprises a first insertion sub-stage and a second insertion sub-stage;

during the first insertion sub-stage, the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of a signal of the third node;

during the second insertion sub-stage, the input sub-circuit provides a signal of the input signal terminal to the first node and provides a signal of the first clock signal terminal to the second node, under a control of the first clock signal terminal; the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of a signal of the third node.

Alternatively, in the aforementioned drive method as provided in embodiments of the present disclosure, a signal of the first clock signal terminal has a same cycle as a signal of the second clock signal terminal, and a percentage of a duration of an active pulse signal of the first clock signal terminal to a duration of one clock cycle is the same as a percentage of a duration of an active pulse signal of the second clock signal terminal to a duration of one said clock cycle;

the percentage of a duration of an active pulse signal of the first clock signal terminal to a duration of one said clock cycle is less than or equal to 50%.

DETAILED DESCRIPTION

To make the objects, technical solutions and advantages of the present disclosure more clear, particular embodiments of the shift register, the drive method thereof, the drive control circuit, and the display apparatus as provided in embodiments of the present disclosure are explained in detail below in combination with the drawings. It should be understood that, the preferred embodiments as described below are only used for explaining and interpreting the present disclosure but not used for limiting the present disclosure. Without collisions, embodiments in the present application and features therein may be combined mutually.

At present, although the output of the gate scan signal may be realized by inputting many control signals having different functions, this results in a large number of switch transistors that form each stage shift register in the gate drive circuit and complexity of specific connection structures between the respective switch transistors, which makes the processes harder and increases the production costs. Even, more signal lines are needed to input various control signals having different functions to each stage shift register, which thus results in a decrease in the aperture ratio of the display panel and makes the display panel uncompetitive.

Embodiments of the present disclosure provide a shift register, a drive method thereof, a drive control circuit, and a display apparatus, for stably outputting signals using a simple structure.

Advantageous effects of the present disclosure are as follows.

The shift register, the drive method thereof, the drive control circuit, and the display apparatus as provided in embodiments of the present disclosure, the shift register comprises: an input sub-circuit, a first control sub-circuit, a second control sub-circuit, a third control sub-circuit, a node stabilization sub-circuit, a first output sub-circuit, and a second output sub-circuit. By a cooperation of the aforementioned seven sub-circuits, the output signal terminal may be caused to output shifted signals by using a simple structure and less signal lines, which thus simplifies the manufacture processes and lowers the production costs. Further, by the cooperation of the aforementioned seven sub-circuits, it is possible to control the duration of the active pulse signal of the signal output from the signal output terminal only by changing the duration of the active pulse signal of the input signal terminal, without the necessity of alterations of circuits and changes of processes, which thus may simplify the manufacture processes, lower the production costs, and facilitate the realization of design of narrow borders of the panel in the display apparatus.

Figure 1:
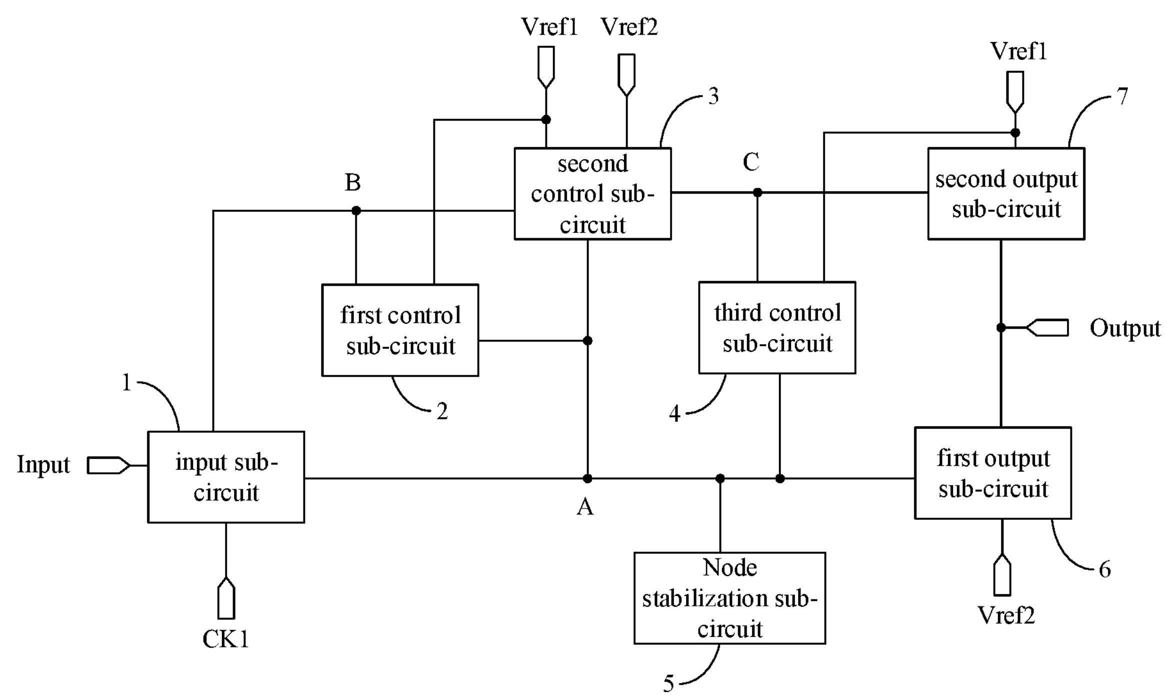
FIG. 1 is a structural schematic diagram of the shift register as provided in embodiments of the present disclosure.

Embodiments of the present disclosure provide a shift register, as shown in FIG. 1, the shift register comprises: an input sub-circuit 1, a first control sub-circuit 2, a second control sub-circuit 3, a third control sub-circuit 4, a node stabilization sub-circuit 5, a first output sub-circuit 6, and a second output sub-circuit 7;

the input sub-circuit 1, which is connected to an input signal terminal "Input" (an input terminal), a first clock signal terminal CK1, a first node A, and a second node B, respectively, is used for providing a signal of the input signal terminal "Input" (the input terminal) to the first node A and providing a signal of the first clock signal terminal CK1 to the second node B, under the control of the first clock signal terminal CK1;

the first control sub-circuit 2, which is connected to a first reference signal terminal Vref1, the first node A, and the second node B, respectively, is used for providing a signal of the first reference signal terminal Vref1 to the second node B under the control of the first node A;

the second control sub-circuit 3, which is connected to the first reference signal terminal Vref1, a second reference signal terminal Vref2, the first node A, the second node B, and a third node C, respectively, is used for providing a signal of the first reference signal terminal Vref1 to the third node C under the control of a signal of the first node A, and providing a signal of the second reference signal terminal Vref2 to the third node C under the control of a signal of the second node B;

the third control sub-circuit 4, which is connected to the first reference signal terminal Vref1, the first node A, and the third node C, respectively, is used for providing a signal of the first reference signal terminal Vref1 to the first node A under the control of the third node C;

the node stabilization sub-circuit 5, which is connected to the first node A, for stabilizing a potential of the first node A;

the first output sub-circuit 6, which is connected to the first node A, the second reference signal terminal Vref2, and an output signal terminal "Output" (an output terminal) of the shift register, respectively, is used for providing a signal of the second reference signal terminal Vref2 to the output signal terminal "Output" (the output terminal) under the control of a signal of the first node A;

the second output sub-circuit 7, which is connected to the third node C, the first reference signal terminal Vref1, and the output signal terminal "Output" (the output terminal), respectively, is used for providing a signal of the first reference signal terminal Vref1 to the output signal terminal "Output" (the output terminal) under the control of a signal of the third node C.

The shift register as provided in embodiments of the present disclosure comprises: an input sub-circuit 1, a first control sub-circuit 2, a second control sub-circuit 3, a third control sub-circuit 4, a node stabilization sub-circuit 5, a first output sub-circuit 6, and a second output sub-circuit 7; the input sub-circuit 1 is used for providing a signal of the input signal terminal to the first node and providing a signal of the first clock signal terminal to the second node, under the control of the first clock signal terminal; the first control sub-circuit 2 is used for providing a signal of the first reference signal terminal to the second node under the control of the first node; the second control sub-circuit 3 is used for providing a signal of the first reference signal terminal to the third node under the control of a signal of the first node, and providing a signal of the second reference signal terminal to the third node under the control of a signal of the second node; the third control sub-circuit 4 is used for providing a signal of the first reference signal terminal to the first node under the control of the third node; the node stabilization sub-circuit 5 is used for stabilizing a potential of the first node; the first output sub-circuit 6 is used for providing a signal of the second reference signal terminal to the output signal terminal under the control of a signal of the first node; the second output sub-circuit 7 is used for providing a signal of the first reference signal terminal to the output signal terminal under the control of a signal of the third node. By a cooperation of the aforementioned seven sub-circuits, the shift register as provided in embodiments of the present disclosure may cause the output signal terminal to stably output shifted signals by using a simple structure and less signal lines, which thus simplifies the manufacture processes and lowers the production costs. Further, by a cooperation of the aforementioned seven sub-circuits, it is possible to control the duration of the active pulse signal of the signal output from the signal output terminal only by changing the duration of the active pulse signal of the input signal terminal, without the necessity of alterations of circuits and changes of processes, which thus may simplify the manufacture processes, lower the production costs, and facilitate the realization of design of narrow borders of the panel in the display apparatus.

During an exemplary implementation, in the shift register as provided in embodiments of the present disclosure, the active pulse signal of the input signal terminal is a high potential signal, the signal of the first reference signal terminal is a high potential signal, and the signal of the second reference signal terminal is a low potential signal. Alternatively, the active pulse signal of the input signal terminal is a low potential signal, the signal of the first reference signal terminal is a low potential signal, and the signal of the second reference signal terminal is a high potential signal.

In combination with exemplary embodiments, the shift register as provided in the present disclosure is explained in detail below. It should be noted that, the present embodiments are for the purpose of better explanations for the present disclosure but do not limit the present disclosure.

Figure 2A:
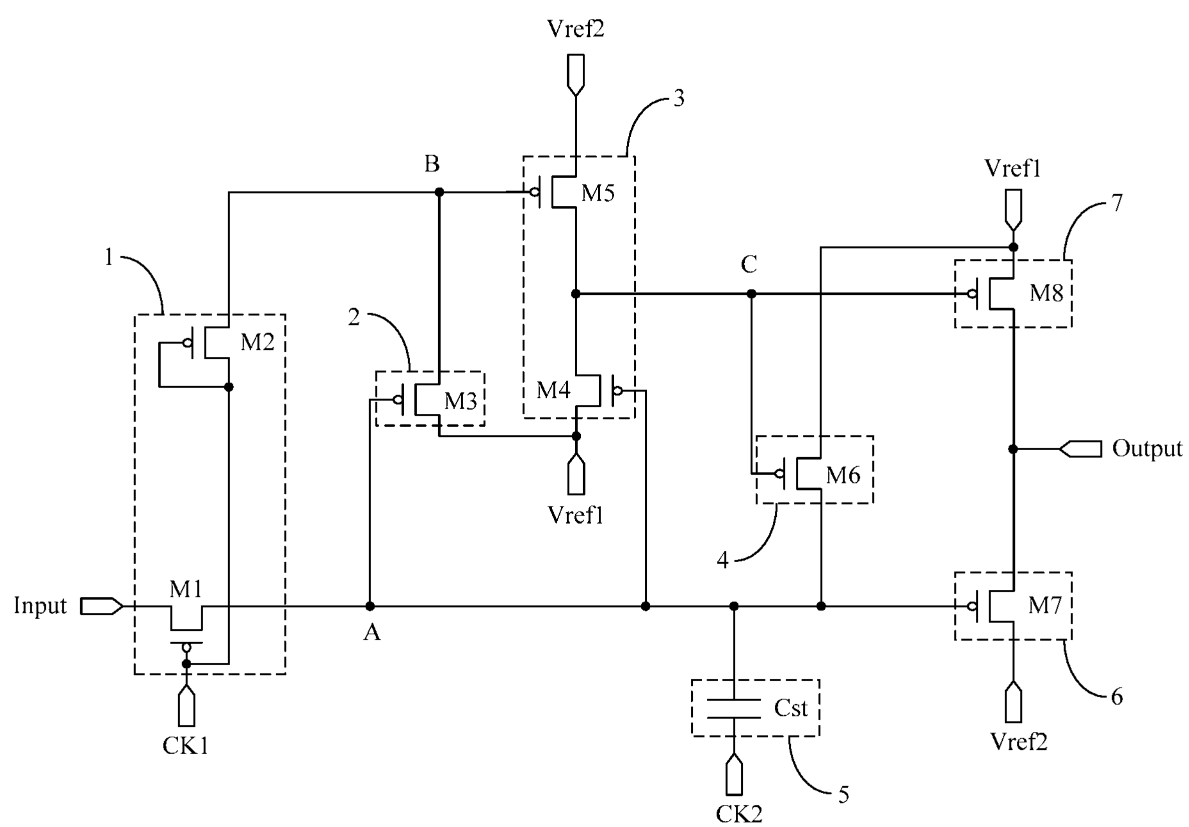
FIG. 2*a* is an exemplary structural schematic diagram of the shift register as provided in embodiments of the present disclosure.
Figure 2B:
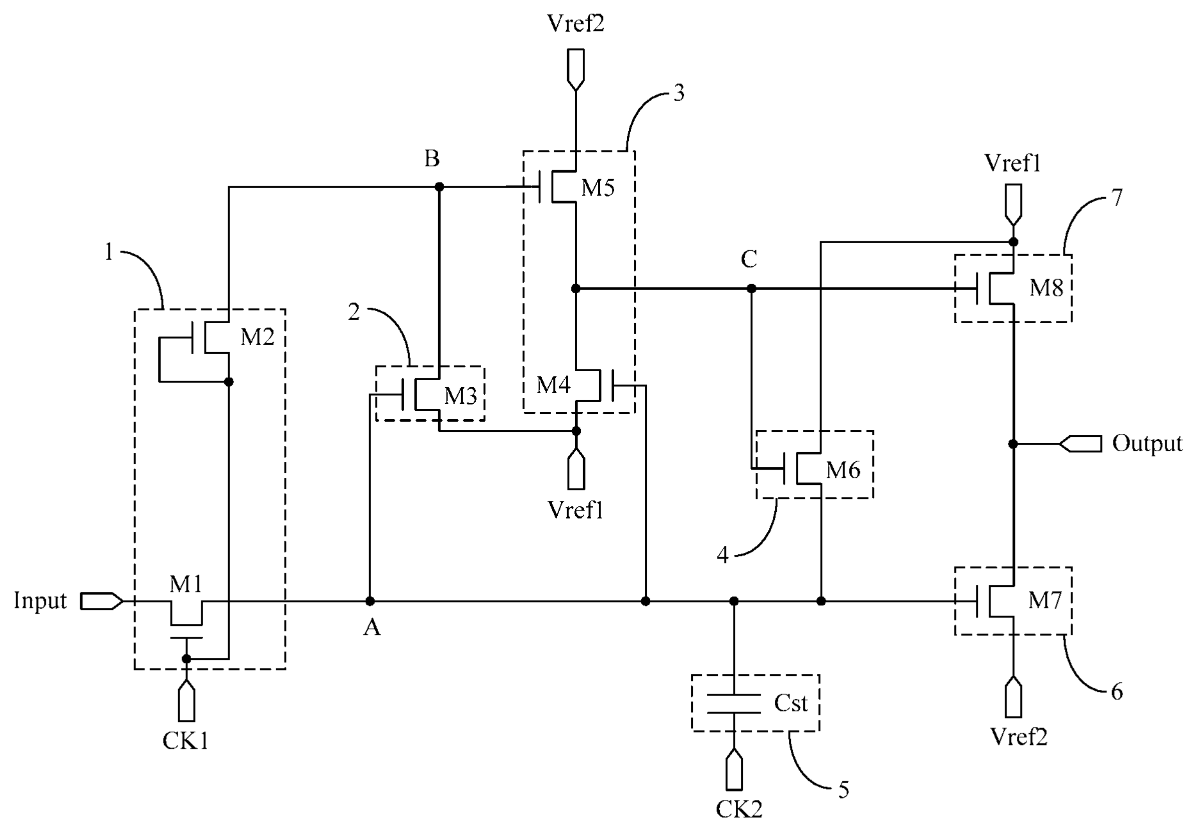
FIG. 2*b* is an exemplary structural schematic diagram of the shift register as provided in embodiments of the present disclosure.

During an exemplary implementation, in the shift register as provided in embodiments of the present disclosure, as shown in FIGS. 2*a* and 2*b*, the input sub-circuit 1 may comprise, for example, a first switch transistor M1 and a second switch transistor M2;

a control electrode of the first switch transistor M1 is connected to the first clock signal terminal CK1, a first electrode of the first switch transistor M1 is connected to the input signal terminal "Input" (the input terminal), and a second electrode of the first switch transistor M1 is connected to the first node A;

both a control electrode and a first electrode of the second switch transistor M2 are connected to the first clock signal terminal CK1, and a second electrode of the second switch transistor M2 is connected to the second node B.

During an exemplary implementation, in the shift register as provided in embodiments of the present disclosure, as shown in FIG. 2*a*, the first switch transistor M1 and the second switch transistor M2 may be P-type transistors. Alternatively, as shown in FIG. 2*b*, the first switch transistor M1 and the second switch transistor M2 may be N-type transistors. No limit is made herein.

During an exemplary implementation, in the shift register as provided in embodiments of the present disclosure, when the first switch transistor is in a conductive state under the control of a signal of the first clock signal terminal, it may provide a signal of the input signal terminal to the first node. When the second switch transistor is in a conductive state under the control of a signal of the first clock signal terminal, it may provide a signal of the first clock signal terminal to the second node.

During an exemplary implementation, in the shift register as provided in embodiments of the present disclosure, as shown in FIGS. 2*a* and 2*b*, the first control sub-circuit 2 may comprise, for example, a third switch transistor M3;

a control electrode of the third switch transistor M3 is connected to the first node A, a first electrode of the third switch transistor M3 is connected to the first reference signal terminal Vref1, and a second electrode of the third switch transistor M3 is connected to the second node B.

During an exemplary implementation, in the shift register as provided in embodiments of the present disclosure, as shown in FIG. 2*a*, the third switch transistor M3 may be a P-type transistor. Alternatively, as shown in FIG. 2*b*, the third switch transistor M3 may be an N-type transistor. No limit is made therein.

During an exemplary implementation, in the shift register as provided in embodiments of the present disclosure, when the third switch transistor is in a conductive state under the control of a signal of the first node, it may provide a signal of the first reference signal terminal to the second node.

During an exemplary implementation, in the shift register as provided in embodiments of the present disclosure, as shown in FIGS. 2*a* and 2*b*, the second control sub-circuit 3 may comprise, for example, a fourth switch transistor M4 and a fifth switch transistor M5;

a control electrode of the fourth switch transistor M4 is connected to the first node A, a first electrode of the fourth switch transistor M4 is connected to the first reference signal terminal Vref1, and a second electrode of the fourth switch transistor M4 is connected to the third node C;

a control electrode of the fifth switch transistor M5 is connected to the second node B, a first electrode of the fifth switch transistor M5 is connected to the second reference signal terminal Vref2, and a second electrode of the fifth switch transistor M5 is connected to the third node C.

During an exemplary implementation, in the shift register as provided in embodiments of the present disclosure, as shown in FIG. 2*a*, the fourth switch transistor M4 and the fifth switch transistor M5 may be P-type transistors. Alternatively, as shown in FIG. 2*b*, the fourth switch transistor M4 and the fifth switch transistor M5 may be N-type transistors. No limit is made herein.

During an exemplary implementation, in the shift register as provided in embodiments of the present disclosure, when the fourth switch transistor is in a conductive state under the control of a signal of the first node, it may provide a signal of the first reference signal terminal to the third node. When the fifth switch transistor is in a conductive state under the control of the second node, it may provide a signal of the second reference signal terminal to the third node.

During an exemplary implementation, in the shift register as provided in embodiments of the present disclosure, as shown in FIGS. 2*a* and 2*b*, the third control sub-circuit 4 may specifically comprise a sixth switch transistor M6;

a control electrode of the sixth switch transistor M6 is connected to the third node C, a first electrode of the sixth switch transistor M6 is connected to the first reference signal terminal Vref1, and a second electrode of the sixth switch transistor M6 is connected to the first node A.

During an exemplary implementation, in the shift register as provided in embodiments of the present disclosure, as shown in FIG. 2*a*, the sixth switch transistor M6 may be a P-type transistor. Alternatively, as shown in FIG. 2*b*, the sixth switch transistor M6 may be an N-type transistor. No limit is made herein.

During an exemplary implementation, in the shift register as provided in embodiments of the present disclosure, when the sixth switch transistor is in a conductive state under the control of a signal of the third node, it may provide a signal of the first reference signal terminal to the first node.

During an exemplary implementation, in the shift register as provided in embodiments of the present disclosure, as shown in FIGS. 2*a* and 2*b*, the first output sub-circuit 6 may comprise, for example, a seventh switch transistor M7;

a control electrode of the seventh switch transistor M7 is connected to the first node A, a first electrode of the seventh switch transistor M7 is connected to the second reference signal terminal Vref2, and a second electrode of the seventh switch transistor M7 is connected to the output signal terminal "Output" (the output terminal).

During an exemplary implementation, in the shift register as provided in embodiments of the present disclosure, as shown in FIG. 2*a*, the seventh switch transistor M7 may be a P-type transistor. Alternatively, as shown in FIG. 2*b*, the seventh switch transistor M7 may be an N-type transistor. No limit is made herein.

During an exemplary implementation, in the shift register as provided in embodiments of the present disclosure, when the seventh switch transistor is in a conductive state under the control of a signal of the first node, it may provide a signal of the second reference signal terminal to the output signal terminal.

During an exemplary implementation, in the shift register as provided in embodiments of the present disclosure, as shown in FIGS. 2*a* and 2*b*, the second output sub-circuit 7 may comprise, for example, an eight switch transistor M8;

a control electrode of the eight switch transistor M8 is connected to the third node C, a first electrode of the eight switch transistor M8 is connected to the first reference signal terminal Vref1, and a second electrode of the eight switch transistor M8 is connected to the output signal terminal "Output" (the output terminal).

During an exemplary implementation, in the shift register as provided in embodiments of the present disclosure, as shown in FIG. 2*a*, the eight switch transistor M8 may be a P-type transistor. Alternatively, as shown in FIG. 2*b*, the eight switch transistor M8 may be an N-type transistor. No limit is made herein.

During an exemplary implementation, in the shift register as provided in embodiments of the present disclosure, when the eight switch transistor is in a conductive state under the control of a signal of the third node, it may provide a signal of the first reference signal terminal to the output signal terminal.

During an exemplary implementation, in the shift register as provided in embodiments of the present disclosure, as shown in FIGS. 2*a* and 2*b*, the node stabilization sub-circuit 5 may comprise, for example, a capacitor Cst. A first terminal of the capacitor Cst is connected to the first node A, and a second terminal of the capacitor Cst is connected to the second clock signal terminal CK2.

During an exemplary implementation, in the shift register as provided in embodiments of the present disclosure, the capacitor may maintain a stable potential of the signal of the first node. Moreover, when the first node is in a floating state, a coupling effect of the capacitor may maintain a stable voltage difference of both terminals of the capacitor, that is, maintain a stable voltage difference between the first node and the second clock signal terminal.

Exemplary structures of the respective sub-circuits in the shift register as provided in embodiments of the present disclosure are only illustrated above, and during an exemplary implementation, structures of the aforementioned respective sub-circuits are not limited to the aforementioned structures as provided in embodiments of the present disclosure, and may be other structures known by those skilled in the art. No limit is made herein.

To simplify the manufacture processes, during an exemplary implementation, in the aforementioned shift register as provided in embodiments of the present disclosure, as shown in FIG. 2*a*, each of the switch transistors may be a P-type transistor. Alternatively, as shown in FIG. 2*b*, each of the switch transistors may be an N-type transistor.

Further, during an exemplary implementation, the P-type transistor is turned off under the action of a high potential signal and is conductive under the action of a low potential signal, and the N-type transistor is conductive under the action of a high potential signal and is turned off under the action of a low potential signal.

It should be noted that, the switch transistors as mentioned in the aforementioned embodiments of the present disclosure may be either Thin Film Transistors (TFTs) or Metal Oxide Semiconductor (MOS) field effect transistors. No limit is made herein. During an exemplary implementation, a control electrode of each of said switch transistors is used as a gate thereof, and based on a signal of the gate and a type of the signal of each of said switch transistors, a first electrode may be used as a source and a second electrode may be used as a drain. Alternatively, a first electrode may be used as a drain and a second electrode may be used as a source. No limit is made herein.

During an exemplary implementation, in the shift register as provided in embodiments of the present disclosure, a signal of the first clock signal terminal has a same cycle as a signal of the second clock signal terminal, and a percentage of a duration of an active pulse signal of the first clock signal terminal to a duration of one clock cycle is the same as a percentage of a duration of an active pulse signal of the second clock signal terminal to a duration of one said clock cycle. In particular, the active pulse signal of the first clock signal terminal is used for controlling conduction of the first transistor and the fifth transistor.

During an exemplary implementation, a percentage of a duration of an active pulse signal of the first clock signal terminal to a duration of one clock cycle may be equal to 50%.

Figure 3A:
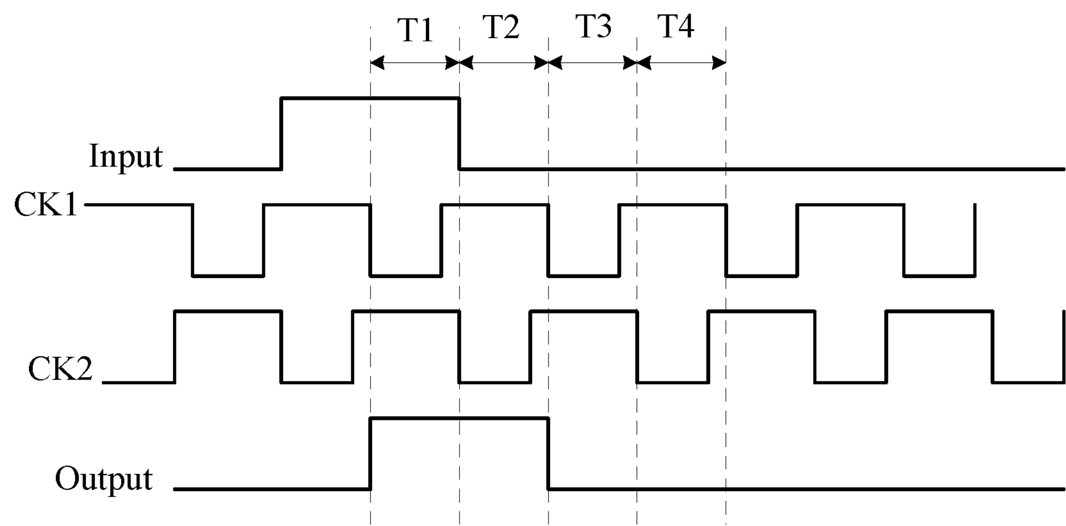
FIG. 3*a* is an illustrative input/output timing diagram of the shift register as shown in FIG. 2*a;*
Figure 3B:
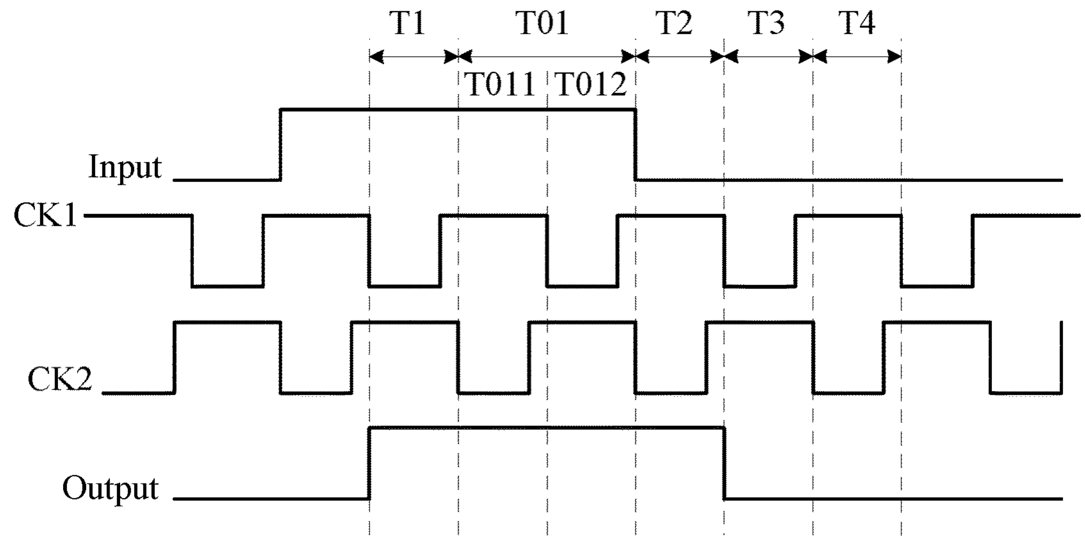
FIG. 3*b* is an illustrative input/output timing diagram of the shift register as shown in FIG. 2*a;*
Figure 3C:
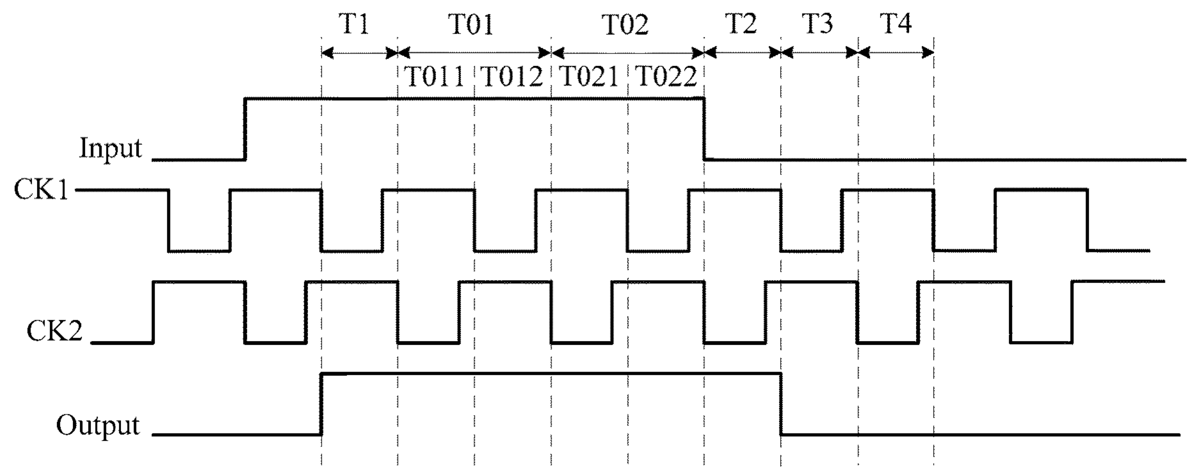
FIG. 3*c* is an illustrative input/output timing diagram of the shift register as shown in FIG. 2*a;*

Alternatively, to cause the entire circuits to operate more stably, for example, when the clock signal having a percentage of 50% instantly changes, to avoid a loss of the shift register which is caused by conduction and short circuit of the second reference signal terminal connected to the seventh transistor and the first reference signal terminal connected to the eight transistor, a percentage of a duration of an active pulse signal of the first clock signal terminal to a duration of one clock cycle may be less than 50%, during an exemplary implementation. For example, as shown in FIGS. 3*a* to 3*c*, both the percentage of a duration of an active pulse signal of the first clock signal terminal CK1 to a duration of one clock cycle and the percentage of a duration of an active pulse signal of the second clock signal terminal CK2 to a duration of one clock cycle are less than 50%. At this time, an active pulse signal of the input signal terminal "Input" (the input terminal) is a high potential signal, and both an active pulse signal of the first clock signal terminal CK1 and an active pulse signal of the second clock signal terminal CK2 are low potential signals. Alternatively, an active pulse signal of the input signal terminal may be a low potential signal. At this time, both an active pulse signal of the first clock signal terminal and an active pulse signal of the second clock signal terminal are high potential signals. In actual applications, the aforementioned percentages can be designed and determined according to actual application environments. No limit is made herein.

The operation process of the aforementioned shift register as provided in embodiments of the present disclosure is described in combination with the circuit timing diagrams. As described below, 1 represents a high potential signal, and 0 represents a low potential signal, wherein 1 and 0 represent logic potentials thereof, which is only for the purpose of better explaining the operation process of the aforementioned shift register as provided in embodiments of the present disclosure, rather than applying potentials to control electrodes of the respective switch transistors during an exemplary implementation.

A structure of the shift register as shown in FIG. 2*a* is taken as an example to describe the operation process thereof. A signal of the first reference signal terminal Vref1 is a high potential signal, and a signal of the second reference signal terminal Vref2 is a low potential signal. A corresponding input/output timing diagram is as shown in FIG. 3*a*, for example, four stages T1, T2, T3 and T4 in the input/output timing diagram as shown in FIG. 3*a* are selected.

During stage T1, Input=1, CK1=0, CK2=1.

Because of CK1=0, both the first switch transistor M1 and the second switch transistor M2 are conductive. In particular, the conductive first switch transistor M1 provides a high potential signal of the input signal terminal "Input" to the first node A such that a signal of the first node A is a high potential signal, and thus all the third switch transistor M3, the fourth switch transistor M4, and the seventh switch transistor M7 are turned off. The conductive second switch transistor M2 provides a low potential signal of the first clock signal terminal CK1 to the second node B such that a signal of the second node B is a low potential signal, and thus the fifth switch transistor M5 is conductive to provide a low potential signal of the second reference signal terminal Vref2 to the third node C such that a signal of the third node C is a low potential signal, and thus both the sixth switch transistor M6 and the eighth switch transistor M8 are conductive. The conductive sixth switch transistor M6 provides a high potential signal of the first reference signal terminal Vref1 to the first node A such that a signal of the first node A is a high potential signal. The conductive eighth switch transistor M8 provides a high potential signal of the first reference signal terminal Vref1 to the output signal terminal "Output" (the output terminal), such that the output signal terminal "Output" (the output terminal) outputs a high potential signal.

Thereafter, during a time where Input=1, Ck1=1, Ck2=1, both the first switch transistor M1 and the second switch transistor M2 are turned off because of CK1=1. Since no additional signal is input to the second node B to charge the second node B, the second node B maintains a low potential signal. The remaining operation process during the time is substantially the same as the operation process during a time where Input=1, Ck1=0, Ck2=1 in stage T1 of the present embodiment. No detailed description is given herein.

During stage T2, Input=1, CK1=1, CK2=0.

Because of CK1=1, both the first switch transistor M1 and the second switch transistor M2 are turned off. Since no additional signal is input to the second node B to charge the second node B, the second node B maintains a low potential signal, such that the fifth switch transistor M5 is conductive to provide the low potential signal of the second reference signal terminal Vref2 to the third node C and that a signal of the third node C is a low potential signal, and thus both the sixth switch transistor M6 and the eight switch transistor M8 are conductive. The conductive sixth switch transistor M6 provides a high potential signal of the first reference signal terminal Vref1 to the first node A such that a signal of the first node A is a high potential signal, and thus all the third switch transistor M3, the fourth switch transistor M4, and the seventh switch transistor M7 are turned off. The conductive eighth switch transistor M8 provides a high potential signal of the first reference signal terminal Vref1 to the output signal terminal "Output" (the output terminal) such that the output signal terminal "Output" (the output terminal) outputs a high potential signal.

Thereafter, during a time where Input=0, CK1=1, CK2=1, the second clock signal terminal CK2 changes from a low potential signal to a high potential signal, and the remaining operation process during the time is substantially the same as the operation process during a time where Input=1, CK1=1, CK2=0 in stage T2 of the present embodiment. No detailed description is given herein. In this way, a simultaneous inversion may be avoided between a potential of a signal of the first clock signal terminal CK1 having a percentage of 50% and a potential of a signal of the second clock signal terminal CK2, which results in a loss of the shift register which is caused by conduction and short circuit of the second reference signal terminal Vref2 connected to the seventh transistor M7 and the first reference signal terminal Vref1 connected to the eighth transistor M8, and thus makes the output of the circuit more stable.

During stage T3, Input=0, CK1=0, CK2=1.

Because of CK1=0, both the first switch transistor M1 and the second switch transistor M2 are conductive. In particular, the conductive first switch transistor M1 provides a low potential signal of the input signal terminal "Input" (the input terminal) to the first node A such that a signal of the first node A is a low potential signal, and thus all the third switch transistor M3, the fourth switch transistor M4, and the seventh switch transistor M7 are conductive and the capacitor Cst is charged. The conductive third switch transistor M3 provides a high potential signal of the first reference signal terminal Vref1 to the second node B such that a signal of the second node B is a high potential signal, and thus the fifth switch transistor M5 is turned off. The conductive fourth switch transistor M4 provides a high potential signal of the first reference signal Vref1 to the third node C such that a signal of the third signal C is a high potential signal, and thus both sixth switch transistor M6 and the eighth switch transistor M8 are turned off. The conductive seventh switch transistor M7 provides a low potential signal of the second reference signal terminal Vref2 to the output signal terminal "Output" (the output terminal) such that the output signal terminal "Output" (the output terminal) outputs a low potential signal.

Thereafter, during a time where Input=1, CK1=1, Ck2=1, both the first switch transistor M1 and the second switch transistor M2 are turned off because of CK1=1, and a signal of the first node A is maintained as a low potential signal due to a coupling effect of the capacitor Cst. The remaining operation process during the time is substantially the same as the operation process during a time Input=1, CK1=0, CK2=1 in stage T3 of the present embodiment. No detailed description is given herein.

During stage T4, Input=0, CK1=1, CK2=0.

Because of CK1=1, both the first switch transistor M1 and the second switch transistor M2 are turned off. Because of CK2=0 and a coupling effect of the capacitor Cst, a potential of a signal of the first node A is further pulled down, such that all the third switch transistor M3, the fourth switch transistor M4, and the seventh switch transistor M7 can be completely conductive. The completely conductive third switch transistor M3 provides a high potential signal of the first reference signal terminal Vref to the second node B without any voltage loss such that a signal of the second node B is a high potential signal, and thus the fifth switch transistor M5 can be completely turned off. The completely conductive fourth switch transistor M4 provides a high potential signal of the first reference signal terminal Vref1 to the third node C without any voltage loss such that a signal of the third node C is a high potential signal, and thus both the sixth switch transistor M6 and the eighth switch transistor M8 are completely turned off. The completely conductive seventh switch transistor M7 provides a low potential signal of the second reference signal terminal Vref2 to the output signal terminal "Output" (the output terminal) without any voltage loss such that the output signal terminal "Output" (the output terminal) completely outputs a low potential signal.

Thereafter, during a time where Input=1, Ck1=1, CK2=1, because of CK2=1 and a coupling effect of the capacitor Cst, a potential of a signal of the first node A returns to an initial low potential so as to prepare a stable low potential signal of the input signal terminal "Input" (the input terminal) during a next stage. The remaining operation process during the time is substantially the same as the operation process during a time where Input=1, CK1=1, CK2=0 in stage T4 of the present embodiment. No detailed description is given herein.

The aforementioned shift register as provided in embodiments of the present disclosure repeats the operation processes of stage T3 and stage T4 after stage T4, until a next frame starts.

The aforementioned shift register as provided in embodiments of the present disclosure may realize a stable shift output of the signal only by using a simple structure of eight switch transistors and one capacitor.

Explanations are made below by taking, as an example, that VGL respectively represents a voltage of a low potential signal of the input signal terminal "Input" (the input terminal), a voltage of a low potential signal of the second reference signal terminal Vref2, and a voltage of a low potential signal of the second clock signal terminal CK2, VGH represents a voltage of a high potential signal of the second clock signal terminal CK2, and a threshold voltage of each of the switch transistors is set as $V_{th}$. In actual applications, when a gate of the P-type switch transistor is a low potential signal, a function of transmitting a low potential signal by the switch transistor is related to a threshold voltage thereof. Therefore, in actual applications, during stage T3 of embodiments of the present disclosure, because of CK1=0 and Input=0, both a gate of the first switch transistor M1 and the signal to be transmitted are a low potential signal, such that the signal transmitted to the first node A has a voltage of $VGL-V_{th}$. Due to the same reason, both a gate of the seventh switch transistor and the signal to be transmitted are also a low potential signal, which thus causes a signal output from the signal output terminal "Output" (the output terminal) to have a voltage of $VGL-2V_{th}$ such that a voltage of a low potential signal output from the signal output terminal "Output" (the output terminal) cannot reach VGL. During stage T4, since the second clock signal terminal CK2 changes from a high potential signal to a low potential signal, a potential of a signal of the first node A is further pulled down due to a coupling effect of the capacitor Cst, such that the voltage of the signal of the first node A jumps to $VGL-V_{th}-(VGH+|VGL|)$ so as to control the seventh switch transistor M7 to be completely conductive, thus causing a voltage of a low potential signal output from the signal output terminal "Output" (the output terminal) to reach VGL and realizing a stable output for the signal output terminal "Output" (the output terminal).

A structure of the shift register as shown in FIG. 2*a* is taken as an example to describe the exemplary operation process thereof. An insertion stage T01 is inserted between stage T1 and stage T2 in the timing diagram of the aforementioned embodiment as shown in FIG. 3*a*, that is to say, on the basis of the aforementioned embodiment as shown in FIG. 3*a*, a duration of an active pulse signal of the input signal terminal "Input" (the input terminal) is extended by one clock cycle, and a corresponding input/output timing diagram is as shown in FIG. 3*b*. In the timing diagram as shown in FIG. 3*b*, five stages of T1, T01, T2, T3, and T4 are selected, wherein the insertion stage T01 is further divided into a first insertion sub-stage T011 and a second insertion sub-stage T012.

During stage T1, Input=1, CK1=0, CK2=1; and then Input=1, CK1=1, Ck2=1. The specific operation process during this stage is substantially the same as the operation process during stage T1 in the aforementioned embodiment as shown in FIG. 3*a*. No detailed description is given herein.

During stage T011 of stage T01, Input=1, Ck1=1, CK2=0.

Because of CK1=1, both the first switch transistor M1 and the second switch transistor M2 are turned off. Since no additional signal is input to the second node B to charge the second node B, the second node B maintains a low potential signal such that the fifth switch transistor M5 is conductive to provide a low potential signal of the second reference signal terminal Vref2 to the third node C and that a signal of the third node C is a low potential signal, and thus both the sixth switch transistor M6 and the eighth switch transistor M8 are conductive. The conductive sixth switch transistor M6 provides a high potential signal of the first reference signal terminal Vref1 to the first node A such that a signal of the first node A is a high potential signal, and thus all the third switch transistor M3, the fourth switch transistor M4, and the seventh switch transistor M7 are turned off. The conductive eighth switch transistor M8 provides a high potential signal of the first reference signal terminal Vref1 to the output signal terminal "Output" (the output terminal) such that the output signal terminal "Output" (the output terminal) outputs a high potential signal.

Thereafter, during a time where Input=1, CK1=1, Ck2=1, since the second clock signal terminal CK2 changes from a low potential signal to a high potential signal, the remaining operation process during the time is substantially the same as the operation process during a time where Input=1, CK1=1, CK2=0 in stage T011 of the present embodiment. No detailed description is given herein. In this way, signals in circuits may have a buffer time that tends to be stable, such that the output is stabilized.

During stage T012, Input=1, CK1=0, CK2=1.

Because of CK1=0, both the first switch transistor M1 and the second switch transistor M2 are conductive. In particular, the conductive first switch transistor M1 provides a high potential signal of the input signal terminal "Input" to the first node A such that a signal of the first node A is a high potential signal, and thus all the third switch transistor M3, the fourth switch transistor M4, and the seventh switch transistor M7 are turned off. The conductive second switch transistor M2 provides a low potential signal of the first clock signal terminal CK1 to the second node B such that a signal of the second node B is a low potential signal, and thus the fifth switch transistor M5 is conductive to provide a low potential signal of the second reference signal terminal Vref2 to the third node C such that a signal of the third node C is a low potential signal, and thus both the sixth switch transistor M6 and the eighth switch transistor M8 are conductive. The conductive sixth switch transistor M6 provides a high potential signal of the first reference signal terminal Vref1 to the first node A such that a signal of the first node A is a high potential signal. The conductive eighth switch transistor M8 provides the high potential signal of the first reference signal Vref1 to the output signal terminal "Output" (the output terminal) such that the output signal terminal "Output" (the output terminal) outputs a high potential signal.

Thereafter, during a time where Input=1, CK1=1, CK2=1, both the first switch transistor M1 and the second switch transistor M2 are turned off because of CK=1. Since no additional signal is input to the second node B to charge the second node B, the second node B maintains a low potential signal. The remaining operation process during the time is substantially the same as the operation process during a time where Input=1, Ck1=0, Ck2=1 in stage T012 of the present embodiment. No detailed description is made herein.

During stage T2, Input=0, CK1=1, CK2=0; and then Input=1, CK1=1, CK2=1. The operation process during this stage is substantially the same as the operation process during stage T2 in the aforementioned embodiment as shown in FIG. 3*a*. No detailed description is given herein.

During stage T3, Input=0, CK1=1, CK2=1; and then Input=0, CK1=1, CK2=1. The operation process during this stage is substantially the same as the operation process during stage T3 in the aforementioned embodiment as shown in FIG. 3*a*. No detailed description is given herein.

During stage T4, Input=0, CK1=1, CK2=0; and then Input=0, CK1=1, CK2=1. The operation process during this stage is substantially the same as the operation process during stage T4 in the aforementioned embodiment as shown in FIG. 3*a*. No detailed description is given herein.

The aforementioned shift register as provided in embodiments of the present disclosure repeats the operation processes of stage T3 and stage T4 after stage T4, until a next frame starts.

The aforementioned shift register as provided in embodiments of the present disclosure may realize a stable shift output of the signal only by using a simple structure of eight switch transistors and one capacitor.

Figure 4A:
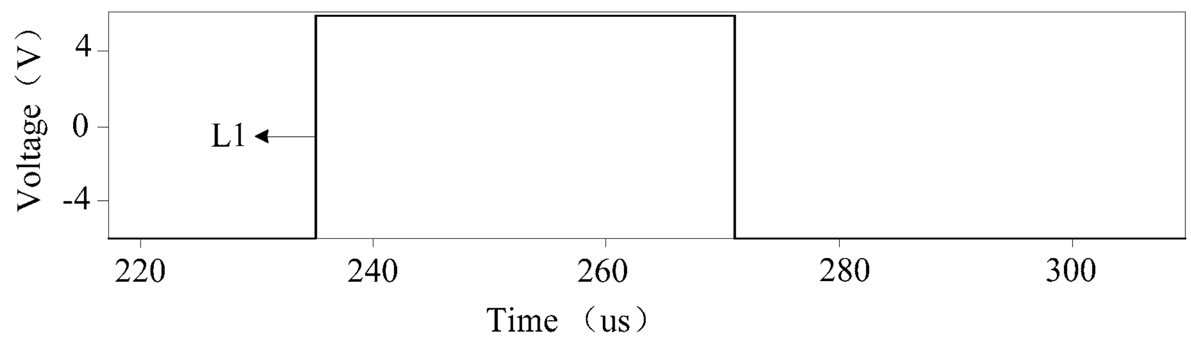
FIG. 4*a* is an illustrative simulation schematic diagram in embodiments of the present disclosure.
Figure 4B:
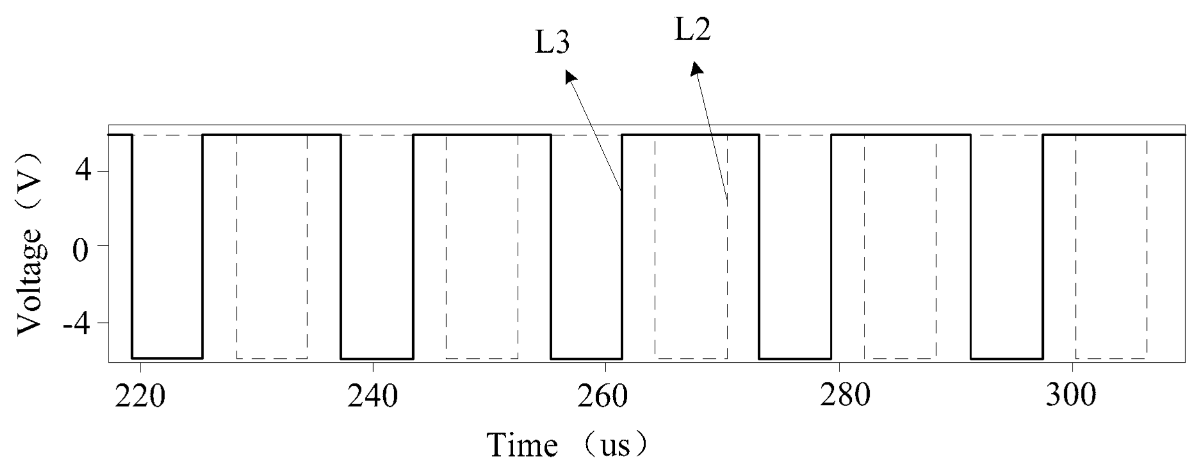
FIG. 4*b* is an illustrative simulation schematic diagram in embodiments of the present disclosure.
Figure 4C:
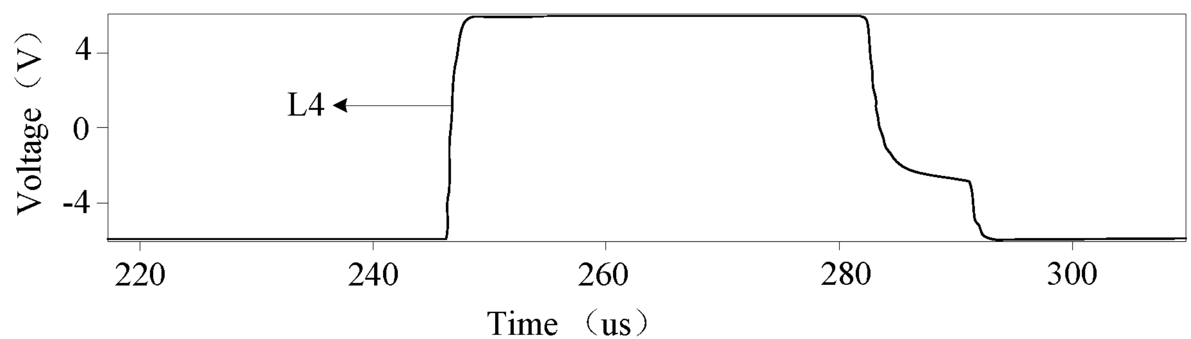
FIG. 4*c* is an illustrative simulation schematic diagram in embodiments of the present disclosure.

The structure as shown in FIG. 2*a* is taken as an example, and the operation process of the shift register is simulated by using the simulation timing diagrams of respective input signals as shown in FIGS. 4*a* and 4*b*. In FIGS. 4*a* and 4*b*, the vertical ordinate represents a voltage and the horizontal ordinate represents a time, wherein L1 in FIG. 4*a* represents a signal of the input signal terminal "Input" (the input terminal); in FIG. 4*b*, L2 represents a signal of the first clock signal terminal CK1, and L3 represents a signal of the second clock signal terminal CK2. During the simulation, a signal of the output signal terminal "Output" (the output terminal) changes as shown in FIG. 4*c*. In FIG. 4*c*, the vertical ordinate represents a voltage and the horizontal ordinate represents a time. From FIG. 4*c*, it can be further seen that, the aforementioned shift register as provided in embodiments of the present disclosure runs stably, such that the signal output terminal "Output" (the output terminal) stably outputs a signal L4.

By taking a structure of the shift register as shown in FIG. 2*a* as an example, the exemplary operation process thereof is described. Two insertion stages T01 and T02 are inserted between stage T1 and stage T2 in the timing diagram of the aforementioned embodiment as shown in FIG. 3*a*, that is to say, on the basis of the aforementioned embodiment as shown in FIG. 3*a*, a duration of an active pulse signal of the input signal terminal "Input" (the input terminal) is extended by two clock cycles, and a corresponding input/output timing diagram is as shown in FIG. 3*c*. In the timing diagram as shown in FIG. 3*c*, six stages of T1, T01, T02, T2, T3, and T4 are selected, wherein the insertion stage T01 is further divided into a first insertion sub-stage T011 and a second insertion sub-stage T012; the insertion stage T02 is further divided into a first insertion sub-stage T021 and a second insertion sub-stage T022.

During stage T1, Input=1, CK1=0, CK2=1; and then Input=1, CK1=1, Ck2=1. The specific operation process during this stage is substantially the same as the operation process during stage T1 in the aforementioned embodiment as shown in FIG. 3*a*. No detailed description is given herein.

During stage T011 of stage T01, Input=1, Ck1=1, CK2=0.

Because of CK1=1, both the first switch transistor M1 and the second switch transistor M2 are turned off. Since no additional signal is input to the second node B to charge the second node B, the second node B maintains a low potential signal such that the fifth switch transistor M5 is conductive to provide a low potential signal of the second reference signal terminal Vref2 to the third node C and that a signal of the third node C is a low potential signal, and thus both the sixth switch transistor M6 and the eighth switch transistor M8 are conductive. The conductive sixth switch transistor M6 provides a high potential signal of the first reference signal terminal Vref1 to the first node A such that a signal of the first node A is a high potential signal, and thus all the third switch transistor M3, the fourth switch transistor M4, and the seventh switch transistor M7 are turned off. The conductive eighth switch transistor M8 provides a high potential signal of the first reference signal terminal Vref1 to the output signal terminal "Output" (the output terminal)

such that the output signal terminal "Output" (the output terminal) outputs a high potential signal.

Thereafter, during a time where Input=1, CK1=1, Ck2=1, the second clock signal terminal CK2 changes from a low potential signal to a high potential signal, and the remaining operation process during the time is substantially the same as the operation process during a time where Input=1, CK1=1, CK2=0 in stage T011 of the present embodiment. No detailed description is given herein.

During stage T012, Input=1, CK1=0, CK2=1.

Because of CK1=0, both the first switch transistor M1 and the second switch transistor M2 are conductive. In particular, the conductive first switch transistor M1 provides a high potential signal of the input signal terminal "Input" (the input terminal) to the first node A such that a signal of the first node A is a high potential signal, and thus all the third switch transistor M3, the fourth switch transistor M4, and the seventh switch transistor M7 are turned off. The conductive second switch transistor M2 provides a low potential signal of the first clock signal terminal CK1 to the second node B such that a signal of the second node B is a low potential signal, and thus the fifth switch transistor M5 is conductive to provide a low potential signal of the second reference signal terminal Vref2 to the third node C such that a signal of the third node C is a low potential signal, and thus both the sixth switch transistor M6 and the eighth switch transistor M8 are conductive. The conductive sixth switch transistor M6 provides a high potential signal of the first reference signal terminal Vref1 to the first node A such that a signal of the first node A is a high potential signal. The conductive eighth switch transistor M8 provides the high potential signal of the first reference signal Vref1 to the output signal terminal "Output" (the output terminal) such that the output signal terminal "Output" (the output terminal) outputs a high potential signal.

Thereafter, during a time where Input=1, CK1=1, CK2=1, both the first switch transistor M1 and the second switch transistor M2 are turned off because of CK=1. Since no additional signal is input to the second node B to charge the second node B, the second node B maintains a low potential signal. The remaining operation process during the time is substantially the same as the operation process during a time where Input=1, Ck1=0, Ck2=1 in stage T012 of the present embodiment. No detailed description is made herein.

During stage T021 of stage T02, Input=1, Ck1=1, CK2=0.

Because of CK1=1, both the first switch transistor M1 and the second switch transistor M2 are turned off. Since no additional signal is input to the second node B to charge the second node B, the second node B maintains a low potential signal, such that the fifth switch transistor M5 is conductive to provide the low potential signal of the second reference signal terminal Vref2 to the third node C and that a signal of the third node C is a low potential signal, and thus both the sixth switch transistor M6 and the eight switch transistor M8 are conductive. The conductive sixth switch transistor M6 provides a high potential signal of the first reference signal terminal Vref1 to the first node A such that a signal of the first node A is a high potential signal, and thus all the third switch transistor M3, the fourth switch transistor M4, and the seventh switch transistor M7 are turned off. The conductive eighth switch transistor M8 provides a high potential signal of the first reference signal terminal Vref1 to the output signal terminal "Output" (the output terminal) such that the output signal terminal "Output" (the output terminal) outputs a high potential signal.

Thereafter, during a time where Input=1, CK1=1, CK2=1, the second clock signal terminal CK2 changes from a low potential signal to a high potential signal, and the remaining operation process during the time is substantially the same as the operation process during a time where Input=1, CK1=1, CK2=0 in stage T021 of the present embodiment. No detailed description is given herein.

During stage T022, Input=1, CK1=0, CK2=1.

Because of CK1=0, both the first switch transistor M1 and the second switch transistor M2 are conductive. In particular, the conductive first switch transistor M1 provides a high potential signal of the input signal terminal "Input" (the input terminal) to the first node A such that a signal of the first node A is a high potential signal, and thus all the third switch transistor M3, the fourth switch transistor M4, and the seventh switch transistor M7 are turned off. The conductive second switch transistor M2 provides a low potential signal of the first clock signal terminal CK1 to the second node B such that a signal of the second node B is a low potential signal, and thus the fifth switch transistor M5 is conductive to provide a low potential signal of the second reference signal terminal Vref2 to the third node C such that a signal of the third node C is a low potential signal, and thus both the sixth switch transistor M6 and the eighth switch transistor M8 are conductive. The conductive sixth switch transistor M6 provides a high potential signal of the first reference signal terminal Vref1 to the first node A such that a signal of the first node A is a high potential signal. The conductive eighth switch transistor M8 provides a high potential signal of the first reference signal terminal Vref1 to the output signal terminal "Output" (the output terminal) such that the output signal terminal "Output" (the output terminal) outputs a high potential signal.

Thereafter, during a time where Input=1, Ck1=1, Ck2=1, both the first switch transistor M1 and the second switch transistor M2 are turned off because of CK1=1. Since no additional signal is input to the second node B to charge the second node B, the second node B maintains a low potential signal. The remaining operation process during the time is substantially the same as the operation process during a time where Input=1, Ck1=0, Ck2=1 in stage T022 of the present embodiment. No detailed description is given herein.

During stage T2, Input=0, CK1=1, CK2=0; and then Input=0, CK1=1, CK2=1. The operation process during this stage is substantially the same as the operation process during stage T2 in the aforementioned embodiment as shown in FIG. 3*a*. No detailed description is given herein.

During stage T3, Input=0, CK1=0, CK2=1; and then Input=0, CK1=1, CK2=1. The operation process during this stage is substantially the same as the operation process during stage T3 in the aforementioned embodiment as shown in FIG. 3*a*. No detailed description is given herein.

During stage T4, Input=0, CK1=1, CK2=0; and then Input=0, CK1=1, CK2=1. The operation process during this stage is substantially the same as the operation process during stage T4 in the aforementioned embodiment as shown in FIG. 3*a*. No detailed description is given herein.

The aforementioned shift register as provided in embodiments of the present disclosure repeats the operation processes of stage T3 and stage T4 after stage T4, until a next frame starts.

The aforementioned shift register as provided in embodiments of the present disclosure may realize a stable shift output of the signal only by using a simple structure of eight switch transistors and one capacitor.

From the aforementioned various embodiments, it can be learned that, on the basis of the signal of the input signal terminal of the aforementioned embodiment as shown in FIG. 3*a*, the aforementioned shift register as provided in embodiments of the present disclosure extends the duration of the active pulse signal of the input signal terminal by one clock signal cycle such that the output signal terminal can output a signal of a corresponding duration in the aforementioned embodiment as shown in FIG. 3*b*, extends the duration of the active pulse signal of the input signal terminal by two clock signal cycles such that the output signal terminal can output a signal of a corresponding duration in the aforementioned embodiment as shown in FIG. 3*c*, and so on. By extending the duration of the active pulse signal, the output signal terminal may be caused to output a signal having a duration that is the same as the duration of the active pulse signal of the input signal terminal. The aforementioned shift register can control the duration of the active pulse signal of the signal output from the signal output terminal only by changing the duration of the active pulse signal of the input signal terminal, without the necessity of alterations of circuits and changes of processes, which thus may reduce process complexity and may lower costs.

During an exemplary implementation, when each of the switch transistors in the aforementioned shift register is an N-type transistor as shown in FIG. 2*b*, a signal of the first reference signal terminal Vref1 is a low potential signal, a signal of the second reference signal terminal Vref2 is a high potential signal, and a signal of the input signal terminal "Input" (the input terminal), a signal of the first clock signal terminal CK1, and a signal of the second clock signal terminal CK2 in the input/output timing diagram corresponding thereto have potentials opposite to those of the corresponding signals in FIGS. 3*a*, 3*b*, and 3*c*. That is to say, a high potential of the respective signals in FIGS. 3*a*, 3*b*, and 3*c* is changed to a low potential, and a low potential of the respective signals is changed to a high potential. Further, when each of the switch transistors in the aforementioned shift register is an N-type transistor, the operation process may refer to the operation process in the aforementioned respective embodiment, which merely changes a high potential signal to a low potential and changes a low potential signal to a high potential signal for the control electrode of each of the switch transistors in each of the aforementioned embodiments. No detailed description is given herein.

Figure 5:
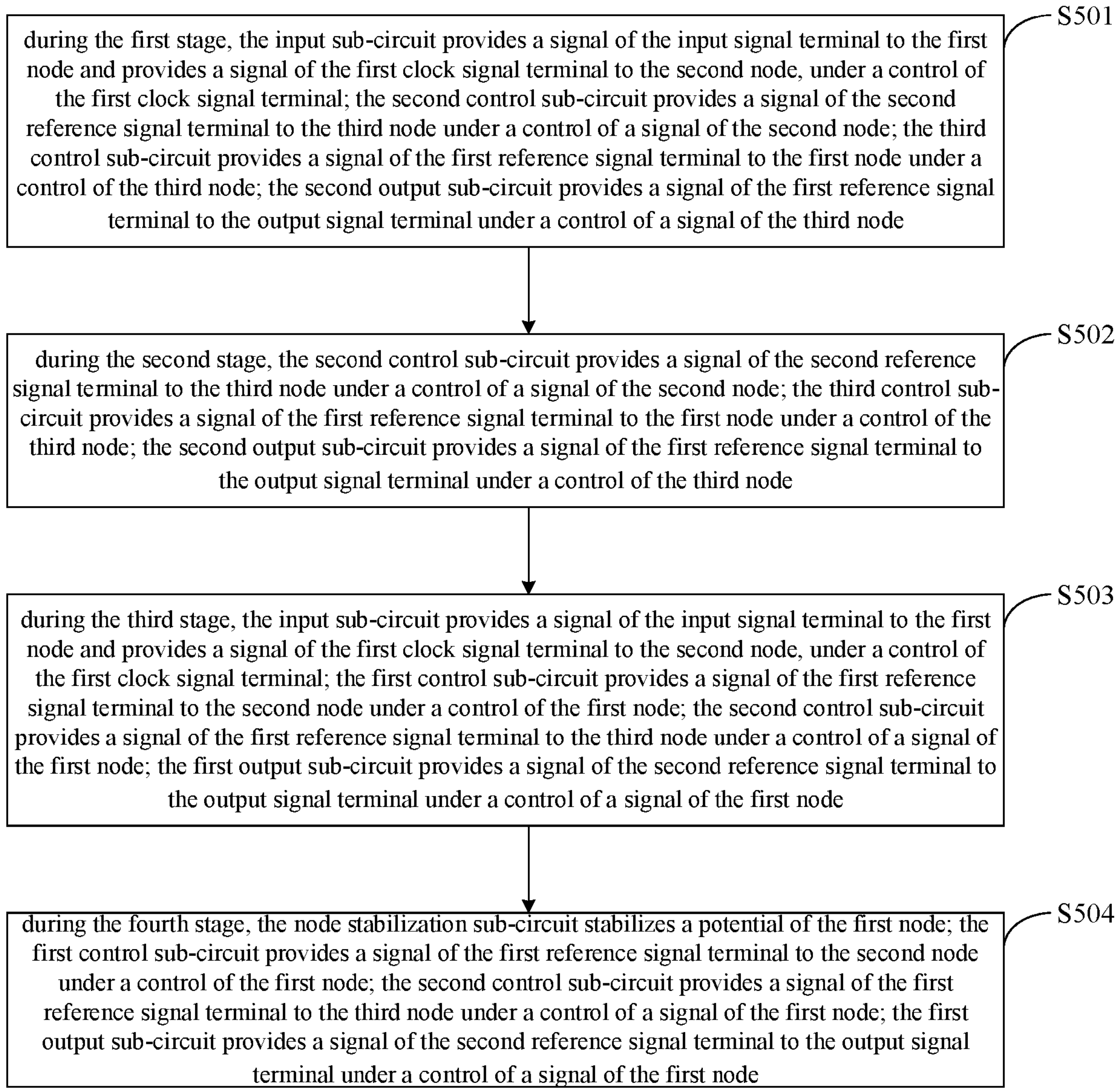
FIG. 5 is a flow chart of the drive method as provided in embodiments of the present disclosure.

Based on the same concept, embodiments of the present disclosure further provide a drive method of any one of said shift register as provided in embodiments of the present disclosure, as shown in FIG. 5, the drive method comprises: a first stage, a second stage, a third stage, and a fourth stage;

S501: during the first stage, the input sub-circuit provides a signal of the input signal terminal to the first node and provides a signal of the first clock signal terminal to the second node, under the control of the first clock signal terminal; the second control sub-circuit provides a signal of the second reference signal terminal to the third node under the control of the second node; the third control sub-circuit provides a signal of the first reference signal terminal to the first node under the control of the third node; the second output sub-circuit provides the signal of the first reference signal terminal to the output signal terminal under the control of a signal of the third node;

S502: during the second stage, the second control sub-circuit provides a signal of the second reference signal terminal to the third node under the control of the second node; the third control sub-circuit provides a signal of the first reference signal terminal to the first node under the control of the third node; the second output sub-circuit provides a signal of the first reference signal to the output signal terminal under the control of the signal of the third node;

S503: during the third stage, the input sub-circuit provides a signal of the input signal terminal to the first node and provides a signal of the first clock signal to the second node, under the control of the first control signal terminal; the first control sub-circuit provides a signal of the first reference signal terminal to the second node under the control of the first node; the second control sub-circuit provides a signal of the first reference signal terminal to the third node under the control of a signal of the first node; the first output sub-circuit provides a signal of the second reference signal terminal to the output signal terminal under the control of a signal of the first node;

S504: during the fourth stage, the node stabilization sub-circuit stabilizes a potential of the first node; the first control sub-circuit provides a signal of the first reference signal terminal to the second node under the control of the first node; the second control sub-circuit provides the signal of the first reference signal terminal to the third node under the control of a signal of the first node; the first output sub-circuit provides a signal of the second reference signal terminal to the output signal terminal under the control of the signal of the first node.

The drive method of the aforementioned shift register as provided in embodiments of the present disclosure may stably output shifted signals, which simplifies the manufacture processes and lowers the production costs.

During an exemplary implementation, after the first stage and before the second stage, the drive method as provided in embodiments of the present disclosure may further comprise: at least one insertion stage, wherein the insertion stage comprises a first insertion sub-stage and a second insertion sub-stage;

during the first insertion sub-stage, the second control sub-circuit provides a signal of the second reference signal terminal to the third node under the control of a signal of the second node; the third control sub-circuit provides a signal of the first reference signal terminal to the first node under the control of the third node; the second output sub-circuit provides the signal of the first reference signal terminal to the output signal terminal under the control of a signal of the third node;

during the second insertion sub-stage, the input sub-circuit provides a signal of the input signal terminal to the first node and provides a signal of the first clock signal terminal to the second node, under the control of the first clock signal; the second control sub-circuit provides a signal of the second reference signal terminal to the third node under the control of a signal of the second node; the third control sub-circuit provides a signal of the first reference signal terminal to the first node under the control of the third node; the second output sub-circuit provides the signal of the first reference signal terminal to the output signal terminal under the control of a signal of the third node.

The aforementioned drive method as provided in embodiments of the present disclosure can control a duration of an active pulse signal of the signal output from the signal output terminal only by inserting at least one insertion stage, without the necessity of alterations of circuits and changes of processes, which thus may simplify the manufacture processes, lower the production costs, and facilitate the realization of design of narrow borders of the panel in the display apparatus.

In actual applications, one insertion stage is inserted between the first stage and the second stage, which operation process corresponds the aforementioned embodiment as shown in FIG. 3*b*. Two insertion stages are inserted between the first stage and the second stage, which operation process corresponds the embodiment as shown in FIG. 3*c*. Certainly, three, four, or more insertion stages may be inserted between the first stage and the second stage. No detailed description is given herein.

During an exemplary implementation, in the drive method as provided in the embodiments of the present disclosure, a signal of the first clock signal terminal has a same cycle as a signal of the second clock signal terminal, and a percentage of a duration of an active pulse signal of the first clock signal terminal to a duration of one clock cycle is the same as a percentage of a duration of an active pulse signal of the second clock signal terminal to a duration of one clock cycle, wherein, the active pulse signal of the first clock signal terminal is used for controlling conduction of the first transistor and the fifth transistor.

During an exemplary implementation, a percentage of a duration of an active pulse signal of the first clock signal terminal to a duration of one clock cycle may be equal to 50%.

Alternatively, to cause the entire circuits to operate more stably, for example, when the clock signal having a percentage of 50% instantly changes, to avoid a loss of the shift register which is caused by conduction and short circuit of the second reference signal terminal connected to the seventh transistor and the first reference signal terminal connected to the eight transistor, a percentage of a duration of an active pulse signal of the first clock signal terminal to a duration of one clock cycle may be less than 50%, during a specific implementation. Specifically, as shown in FIGS. 3*a* to 3*c*, both the percentage of a duration of an active pulse signal of the first clock signal terminal CK1 to a duration of one clock cycle and the percentage of a duration of an active pulse signal of the second clock signal terminal CK2 to a duration of one clock cycle are less than 50%. At this time, an active pulse signal of the input signal terminal "Input" (the input terminal) is a high potential signal, and both an active pulse signal of the first clock signal terminal CK1 and an active pulse signal of the second clock signal terminal CK2 are low potential signals. Alternatively, an active pulse signal of the input signal terminal may also be a low potential signal. At this time, both an active pulse signal of the first clock signal terminal and an active pulse signal of the second clock signal terminal are high potential signals. In actual applications, the aforementioned percentages can be designed and determined according to actual application environments. No limit is made herein.

Figure 6:
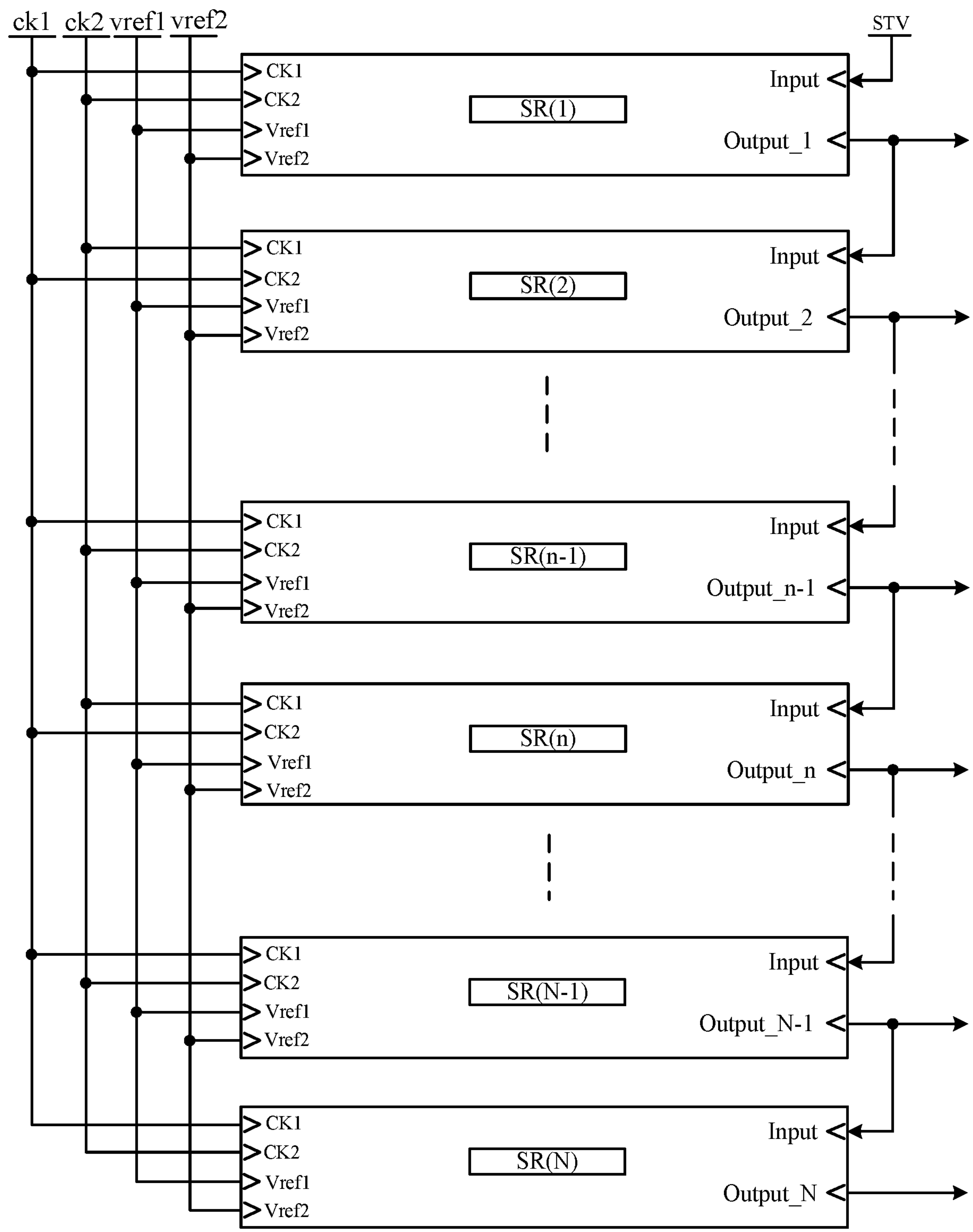
FIG. 6 is a structural schematic diagram of the drive control circuit as provided in embodiments of the present disclosure.

Based on the same concept, embodiments of the present disclosure further provide a drive control circuit, as shown in FIG. 6, the drive control circuit comprises: a plurality of any one of said cascaded shift registers as provided in embodiments of the present disclosure: SR(1), SR(2) . . . SR(N) . . . SR(N−1), SR(N) (totally N shift registers, 1≤n≤N); N is a positive integer, and n is a positive integer;

an input signal terminal "Input" (the input terminal) of the first-stage shift register SR(1) is connected to an initial signal terminal STV;

an input signal terminal "Input" (the input terminal) of each stage shift register SR(n) other than the first-stage shift register SR(1) is connected to an output signal terminal "Output" (the output terminal) of a last-stage shift register SR(n−1) neighboring thereto.

For example, each of the shift registers in the aforementioned drive control circuit is the same as the aforementioned shift register of the present disclosure in terms of function and structure. No detailed description is given herein.

The aforementioned drive control circuit as provided in embodiments of the present disclosure may be used for providing a light emission control signal of the light emission control transistor, or may be used for providing a gate scan signal of the scan control transistor. No limit is made herein.

During an exemplary implementation, in the drive control circuit as provided in the present disclosure, as shown in FIG. 6, both the first clock signal terminal CK1 of the (2k−1)th-stage shift register and the second clock signal terminal CK2 of the 2kth-stage shift register are connected to the same clock terminal, namely the first clock signal CK1; both the second clock signal terminal CK2 of the (2k−1)th-stage shift register and the first clock signal terminal CK1 of the 2kth-stage shift register are connected to the same clock terminal, namely the second clock signal CK2, wherein k is a positive integer.

Further, in an exemplary implementation, in the drive control circuit as provided in the present disclosure, as shown in FIG. 6, the first reference signal terminal Vref1 of each stage shift register SR(n) is connected to the same signal terminal, namely the first reference terminal Vref1; the second reference signal terminal Vref2 of each stage shift register SR(n) is connected to the same signal terminal, namely the second reference terminal Vref1.

Based on the same concept, embodiments of the present disclosure further provide a display apparatus, the display apparatus comprises the aforementioned drive control circuit as provided in embodiments of the present disclosure. The implementation of the display apparatus may refer to embodiments of the aforementioned shift register. No detailed description is given herein.

During an exemplary implementation, the aforementioned display apparatus as provided in embodiments of the present disclosure may be an organic light-emitting display apparatus or a liquid crystal display apparatus. No limit is made herein.

The organic light-emitting display apparatus is generally provided with a plurality of organic light-emitting diodes, a pixel compensation circuit which is connected to each of the plurality of organic light-emitting diodes, a plurality of gate lines, and a plurality of light emission control signal lines. The pixel compensation circuit is generally provided with a light emission control transistor for controlling light emission of the organic light-emitting diodes and a scan control transistor for controlling input of data signals. In particular, a control electrode of the light emission control transistor is connected to a light emission control signal line corresponding to a row where it resides, for receiving a light emission control signal; a control electrode of the scan control transistor is connected to a gate line corresponding to a row where it resides, for receiving a gate scan signal. During an exemplary implementation, when the aforementioned display apparatus as provided in embodiments of the present disclosure is an organic light-emitting display apparatus, the drive control circuit may be used for providing a light emission control signal of the light emission control transistor, wherein a signal output terminal of each stage shift register in the drive control circuit is connected to one of the light emission control signal lines. Alternatively, the drive control circuit may be also used for providing a gate scan signal of the scan control transistor, wherein the drive control circuit is a gate drive circuit, and a signal output terminal of each stage shift register in the drive control circuit is connected to one of the gate lines.

Further, when the display apparatus as provided in embodiments of the present disclosure is an organic light-emitting display apparatus, two drive control circuits may be provided, wherein one drive control circuit is used for providing a light emission control signal of the light emission control transistor, and a signal output terminal of each stage shift register in the drive control circuit is connected to one of the light emission control signal lines; the other drive control circuit is used as a gate drive circuit for providing a gate scan signal of the scan control transistor, and a signal output terminal of each stage shift register in the drive control circuit is connected to one of the gate lines. No limit is made herein.

When the aforementioned display apparatus as provided in embodiments of the present disclosure is a liquid crystal display apparatus, a plurality of pixel electrodes, a switch transistor which is connected to each of the plurality of pixel electrodes, and a plurality of gates are generally provided. In particular, control electrodes of each row of switch transistors are connected to a gate line corresponding to the row where they reside. The aforementioned drive control circuit as provided in embodiments of the present disclosure may be used as a gate drive circuit for providing a gate drive signal of the switch transistor, and a signal output terminal of each stage shift register in the drive control circuit is connected to one of the gate lines.

In an exemplary implementation, the display apparatus as provided in embodiments of the present disclosure may be a mobile phone, a tablet computer, a TV set, a display, a laptop, a digital photo frame, a navigator, or any other product or component having a display function. Other indispensable component parts of the display apparatus are owned as understood by those skilled in the art, which is not further described herein and should not be used as a limit to the present disclosure.

The shift register, the drive method, the drive control circuit, and the display apparatus are provided in embodiments of the present disclosure, the shift register comprises: an input sub-circuit, a first control sub-circuit, a second control sub-circuit, a third control sub-circuit, a node stabilization sub-circuit, a first output sub-circuit, and a second output sub-circuit. The input sub-circuit is used for providing a signal of the input signal terminal to the first node and providing a signal of the first clock signal terminal to the second node, under the control of the first clock signal terminal; the first control sub-circuit is used for providing a signal of the first reference signal terminal to the second node under the control of the first node; the second control sub-circuit is used for providing a signal of the first reference signal terminal to the third node under the control of a signal of the first node, and for providing a signal of the second reference signal terminal to the third node under the control of the third node; the third control sub-circuit is used for providing signal of the first reference signal terminal to the first node under the control of the third node; the node stabilization sub-circuit is used for stabilizing a potential of the first node; the first output sub-circuit is used for providing a signal of the second reference signal terminal to the output signal terminal under the control of a signal of the first node; the second output sub-circuit is used for providing a signal of the first reference signal terminal to the output signal terminal under the control of a signal of the third node. By a cooperation of the aforementioned seven sub-circuits, the shift register as provided in embodiments of the present disclosure causes the output signal terminal to stably output shifted signals by using a simple structure and less signal lines, which thus simplifies the manufacture processes and lowers the production costs. Further, by a cooperation of the aforementioned seven sub-circuits, it is possible to control the duration of the active pulse signal of the signal output from the signal output terminal only by changing the duration of the active pulse signal of the input signal terminal, without the necessity of alterations of circuits and changes of processes, which thus may simplify the manufacture processes, lower the production costs, and facilitate the realization of design of narrow borders of the panel in the display apparatus.

Obviously, those skilled in the art may make various alterations and modifications for the present disclosure, without deviating from the spirit and scope of the present disclosure. In this way, even if these alterations and modifications of the present disclosure fall into the scope of the claims of the present disclosure and equivalent technologies thereof, the present disclosure intends to contain these alterations and modifications too.

What is claimed is:

1. A shift register, comprising: an input sub-circuit, a first control sub-circuit, a second control sub-circuit, a third control sub-circuit, a node stabilization sub-circuit, a first output sub-circuit, and a second output sub-circuit; wherein, the input sub-circuit, which is connected to an input signal terminal, a first clock signal terminal, a first node and a second node, respectively, is used for providing a signal of the input signal terminal to the first node and providing a signal of the first clock signal terminal to the second node, under a control of the first clock signal terminal;

the first control sub-circuit, which is connected to a first reference signal terminal, the first node and the second node, respectively, is used for providing a signal of the first reference signal terminal to the second node under a control of the first node;

the second control sub-circuit, which is connected to the first reference signal terminal, a second reference signal terminal, the first node, the second node and a third node, respectively, is used for providing a signal of the first reference signal terminal to the third node under a control of a signal of the first node and providing a signal of the second reference signal terminal to the third node under a control of a signal of the second node;

the third control sub-circuit, which is connected to the first reference signal terminal, the first node and the third node, respectively, is used for providing a signal of the first reference signal to the first node under a control of the third node;

the node stabilization sub-circuit, which is connected to the first node, is used for stabilizing a potential of the first node;

the first output sub-circuit, which is connected to the first node, the second reference signal terminal, and an output signal terminal of the shift register, respectively, is used for providing a signal of the second reference signal terminal to the output signal terminal under a control of a signal of the first node; and the second output sub-circuit, which is connected to the third node, the first reference signal terminal and the output signal terminal, respectively, is used for providing a signal of the first reference signal terminal to the output signal terminal under a control of a signal of the third node.

2. The shift register according to claim 1, wherein the input sub-circuit comprises a first switch transistor and a second switch transistor;

a control electrode of the first switch transistor is connected to the first clock signal terminal, a first electrode of the first switch transistor is connected to the input signal terminal, and a second electrode of the first switch transistor is connected to the first node; and both a control electrode and a first electrode of the second switch transistor are connected to the first clock signal terminal, and a second electrode of the second switch transistor is connected to the second node.

3. The shift register according to claim 2, wherein each of the first and second switch transistors is a P-type transistor, a first electrode of each of the first and second switch transistors is a source of the P-type transistor, and a second electrode of each of the first and second switch transistors is a drain of the P-type transistor.

4. The shift register according to claim 2, wherein each of the first and second switch transistors is an N-type transistor, a first electrode of each of the first and second switch transistors is a drain of the N-type transistor, and a second electrode of each of the first and second switch transistors is a source of the N-type transistor.

5. The shift register according to claim 1, wherein the first control sub-circuit comprises a third switch transistor;

a control electrode of the third switch transistor is connected to the first node, a first electrode of the third switch transistor is connected to the first reference signal terminal, and a second electrode of the third switch transistor is connected to the second node.

6. The shift register according to claim 1, wherein the second control sub-circuit comprises a fourth switch transistor and a fifth switch transistor;

a control electrode of the fourth switch transistor is connected to the first node, a first electrode of the fourth switch transistor is connected to the first reference signal terminal, and a second electrode of the fourth switch transistor is connected to the third node; and a control electrode of the fifth switch transistor is connected to the second node, a first electrode of the fifth switch transistor is connected to the second reference signal terminal, and a second electrode of the fifth switch transistor is connected to the third node.

7. The shift register according to claim 1, wherein the third control sub-circuit comprises a sixth switch transistor;

a control electrode of the sixth switch transistor is connected to the third node, a first electrode of the sixth switch transistor is connected to the first reference signal terminal, and a second electrode of the sixth switch transistor is connected to the first node.

8. The shift register according to claim 1, wherein the first output sub-circuit comprises a seventh switch transistor;

a control electrode of the seventh switch transistor is connected to the first node, a first electrode of the seventh switch transistor is connected to the second reference signal terminal, and a second electrode of the seventh switch transistor is connected to the output signal terminal.

9. The shift register according to claim 1, wherein the second output sub-circuit comprises an eighth switch transistor;

a control electrode of the eighth switch transistor is connected to the third node, a first electrode of the eighth switch transistor is connected to the first reference signal terminal, and a second electrode of the eighth switch transistor is connected to the output signal terminal.

10. The shift register according to claim 1, wherein the node stabilization sub-circuit comprises a capacitor; a first terminal of the capacitor is connected to the first node, and a second terminal of the capacitor is connected to a second clock signal terminal.

11. The shift register according to claim 1, wherein, the input sub-circuit comprises the first switch transistor and the second switch transistor, wherein a control electrode of the first switch transistor is connected to the first clock signal terminal, a first electrode of the first switch transistor is connected to the input signal terminal, and a second electrode of the first switch transistor is connected to the first node; and both a control electrode and a first electrode of the second switch transistor are connected to the first clock signal terminal, and a second electrode of the second switch transistor is connected to the second node;

the first control sub-circuit comprises a third switch transistor, wherein a control electrode of the third switch transistor is connected to the first node, a first electrode of the third switch transistor is connected to the first reference signal terminal, and a second electrode of the third switch transistor is connected to the second node;

the second control sub-circuit comprises a fourth switch transistor and a fifth switch transistor, wherein a control electrode of the fourth switch transistor is connected to the first node, a first electrode of the fourth switch transistor is connected to the first reference signal terminal, and a second electrode of the fourth switch transistor is connected to the third node; and a control electrode of the fifth switch transistor is connected to the second node, a first electrode of the fifth switch transistor is connected to the second reference signal terminal, and a second electrode of the fifth switch transistor is connected to the third node;

the third control sub-circuit comprises a sixth switch transistor, wherein a control electrode of the sixth switch transistor is connected to the third node, a first electrode of the sixth switch transistor is connected to the first reference signal terminal, and a second electrode of the sixth switch transistor is connected to the first node;

the first output sub-circuit comprises a seventh switch transistor, wherein a control electrode of the seventh switch transistor is connected to the first node, a first electrode of the seventh switch transistor is connected to the second reference signal terminal, and a second electrode of the seventh switch transistor is connected to the output signal terminal;

the second output sub-circuit comprises an eighth switch transistor, wherein a control electrode of the eighth switch transistor is connected to the third electrode, a first electrode of the eighth switch transistor is connected to the first reference signal terminal, and a second electrode of the eighth switch transistor is connected to the output signal terminal; and the node stabilization sub-circuit comprises a capacitor, wherein a first terminal of the capacitor is connected to the first node, and a second terminal of the capacitor is connected to a second clock signal terminal.

12. A drive control circuit, comprising: a plurality of cascaded shift registers according to claim 1;

an input signal terminal of a first-stage shift register is connected to an initial signal terminal;

an input signal terminal of each stage shift register other than the first-stage shift register is connected to an output signal terminal of a last-stage shift register neighboring thereto.

13. A display apparatus, comprising the drive control circuit according to claim 12.

14. The display apparatus according to claim 13, wherein the display apparatus comprises a plurality of light emission control signal lines; a signal output terminal of each stage shift register in the drive control circuit is connected to one of the plurality of light emission control signal lines.

15. The display apparatus according to claim 13, wherein the drive control circuit is a gate drive circuit.

16. A drive method of a shift register which comprises an input sub-circuit, a first control sub-circuit, a second control sub-circuit, a third control sub-circuit, a node stabilization sub-circuit, a first output sub-circuit, and a second output sub-circuit wherein the input sub-circuit, which is connected to an input signal terminal, a first clock signal terminal, a first node and a second node, respectively, is used for providing a signal of the input signal terminal to the first node and providing a signal of the first clock signal terminal to the second node, under a control of the first clock signal terminal; the first control sub-circuit, which is connected to a first reference signal terminal, the first node and the second node, respectively, is used for providing a signal of the first reference signal terminal to the second node under a control of the first node; the second control sub-circuit, which is connected to the first reference signal terminal, a second reference signal terminal, the first node, the second node and a third node, respectively, is used for providing a signal of the first reference signal terminal to the third node under a control of a signal of the first node and providing a signal of the second reference signal terminal to the third node under a control of a signal of the second node; the third control sub-circuit, which is connected to the first reference signal terminal, the first node and the third node, respectively, is used for providing a signal of the first reference signal to the first node under a control of the third node; the node stabilization sub-circuit, which is connected to the first node, is used for stabilizing a potential of the first node; the first output sub-circuit, which is connected to the first node, the second reference signal terminal, and an output signal terminal of the shift register, respectively, is used for providing a signal of the second reference signal terminal to the output signal terminal under a control of a signal of the first node; and the second output sub-circuit, which is connected to the third node, the first reference signal terminal and the output signal terminal, respectively, is used for providing a signal of the first reference signal terminal to the output signal terminal under a control of a signal of the third node, the drive method comprising: a first stage, a second stage, a third stage, and a fourth stage;

during the first stage, the input sub-circuit provides a signal of the input signal terminal to the first node and provides a signal of the first clock signal terminal to the second node, under a control of the first clock signal terminal; the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of a signal of the third node;

during the second stage, the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of the third node;

during the third stage, the input sub-circuit provides a signal of the input signal terminal to the first node and provides a signal of the first clock signal terminal to the second node, under a control of the first clock signal terminal; the first control sub-circuit provides a signal of the first reference signal terminal to the second node under a control of the first node; the second control sub-circuit provides a signal of the first reference signal terminal to the third node under a control of a signal of the first node; the first output sub-circuit provides a signal of the second reference signal terminal to the output signal terminal under a control of a signal of the first node;

during the fourth stage, the node stabilization sub-circuit stabilizes a potential of the first node; the first control sub-circuit provides a signal of the first reference signal terminal to the second node under a control of the first node; the second control sub-circuit provides a signal of the first reference signal terminal to the third node under a control of a signal of the first node; the first output sub-circuit provides a signal of the second reference signal terminal to the output signal terminal under a control of a signal of the first node.

17. The drive method according to claim 16, after the first stage and before the second stage, further comprising: at least one insertion stage, wherein the insertion stage comprises a first insertion sub-stage and a second insertion sub-stage;

during the first insertion sub-stage, the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of a signal of the third node;

during the second insertion sub-stage, the input sub-circuit provides a signal of the input signal terminal to the first node and provides a signal of the first clock signal terminal to the second node, under a control of the first clock signal terminal; the second control sub-circuit provides a signal of the second reference signal terminal to the third node under a control of a signal of the second node; the third control sub-circuit provides a signal of the first reference signal terminal to the first node under a control of the third node; the second output sub-circuit provides a signal of the first reference signal terminal to the output signal terminal under a control of a signal of the third node.

18. The drive method according to claim 17, wherein a signal of the first clock signal terminal has a same cycle as a signal of a second clock signal terminal, and a percentage of a duration of an active pulse signal of the first clock signal terminal to a duration of one clock cycle is the same as a percentage of a duration of an active pulse signal of the second clock signal terminal to a duration of one said clock cycle;

the percentage of a duration of an active pulse signal of the first clock signal terminal to a duration of one said clock cycle is less than or equal to 50%.

* * * * *